(12) United States Patent
Hu et al.

(10) Patent No.: US 11,557,239 B2
(45) Date of Patent: Jan. 17, 2023

(54) SCANNING CIRCUIT, DISPLAY PANEL AND DISPLAY DEVICE

(71) Applicants: KUNSHAN NEW FLAT PANEL DISPLAY TECHNOLOGY CENTER CO., LTD., Jiangsu (CN); KUNSHAN GO-VISIONOX OPTO-ELECTRONICS CO., LTD., Jiangsu (CN)

(72) Inventors: Zuquan Hu, Kunshan (CN); Zengbiao Sun, Kunshan (CN)

(73) Assignees: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 17/502,378

(22) Filed: Oct. 15, 2021

(65) Prior Publication Data
US 2022/0036790 A1 Feb. 3, 2022

Related U.S. Application Data

(63) Continuation of application No. PCT/CN2020/093778, filed on Jun. 1, 2020.

(30) Foreign Application Priority Data

Sep. 26, 2019 (CN) .......................... 201910919167.0

(51) Int. Cl.
G09G 3/20 (2006.01)

(52) U.S. Cl.
CPC ....... *G09G 3/20* (2013.01); *G09G 2300/0809* (2013.01); *G09G 2310/0267* (2013.01); *G09G 2310/061* (2013.01); *G09G 2310/08* (2013.01)

(58) Field of Classification Search
CPC ... G09G 2310/0286; G09G 2310/0267; G09G 2310/061; G09G 2310/08
See application file for complete search history.

(56) References Cited

U.S. PATENT DOCUMENTS

| 8,803,562 B2 | 8/2014 | Chung |
| 2015/0061982 A1 | 3/2015 | Woo |

(Continued)

FOREIGN PATENT DOCUMENTS

| CN | 101527110 B | 6/2011 |
| CN | 104157236 A | 11/2014 |

(Continued)

OTHER PUBLICATIONS

International Search Report dated Sep. 1, 2020 in corresponding International Application No. PCT/CN2020/093778; 4 pages.

(Continued)

*Primary Examiner* — Gerald Johnson
(74) *Attorney, Agent, or Firm* — Maier & Maier, PLLC

(57) ABSTRACT

A scanning circuit, a display panel and a display device. The scanning circuit includes a scanning signal output module, a light emitting control signal output module, a first output control module, a second output control module, a reset module, a clock signal input terminal, a first potential signal input terminal, a second potential signal input terminal, a scanning signal output terminal, a light emitting control signal output terminal, a shift signal input terminal and a reset control signal input terminal.

20 Claims, 11 Drawing Sheets

(56) References Cited

U.S. PATENT DOCUMENTS

| | | | |
|---|---|---|---|
| 2017/0025068 A1* | 1/2017 | Jeoung | G09G 3/3266 |
| 2019/0019462 A1* | 1/2019 | Kim | G09G 3/3677 |
| 2019/0311690 A1* | 10/2019 | Chen | G06F 3/0416 |
| 2020/0202967 A1* | 6/2020 | Hu | G09G 3/2092 |

FOREIGN PATENT DOCUMENTS

| | | |
|---|---|---|
| CN | 104183219 A | 12/2014 |
| CN | 104409038 A | 3/2015 |
| CN | 104900184 A | 9/2015 |
| CN | 105223746 A | 1/2016 |
| CN | 105609042 A | 5/2016 |
| CN | 105632410 A | 6/2016 |
| CN | 105702295 A | 6/2016 |
| CN | 104933990 B | 3/2017 |
| CN | 104409038 B | 5/2017 |
| CN | 106782337 A | 5/2017 |
| CN | 108230999 A | 6/2018 |
| CN | 108447448 A | 8/2018 |
| CN | 109243373 A | 1/2019 |
| CN | 110619852 A | 12/2019 |
| KR | 20180138473 A | 12/2018 |

OTHER PUBLICATIONS

First Office Action dated Jul. 24, 2020 in corresponding Chinese Application No. 201910919167.0; 12 pages; Machine translation attached.

Zhang Jun et al., "New Design of Narrow border LCD panel", Chinese Journal of Liquid Crystals and Displays, vol. 30, No. 3, Jun. 2015, 5 pgs.

Fang Song, "A Novel a-Si:H TFT Integrated Gate Driver", Information and Communications, No. 169,2017, 3 pgs.

* cited by examiner

SCANNING CIRCUIT, DISPLAY PANEL AND DISPLAY DEVICE

CROSS-REFERENCES TO RELATED APPLICATION

This is a continuation of International Patent Application No. PCT/CN2020/093778, filed on Jun. 1, 2020, which claims priority to Chinese Patent Application No. 201910919167.0 filed on Sep. 26, 2019, the disclosures of which are incorporated herein by reference in their entireties.

TECHNICAL FIELD

The present disclosure relates to the field of display technologies, for example, to a scanning circuit, a display panel and a display device.

BACKGROUND

With the development of display technologies, the requirement for screen-to-body ratio is getting higher and higher, which requires the display panel to have a smaller bezel width.

The bezel part of the display panel in the related art includes a scanning circuit, a power signal line and the like, and the scanning circuit needs to occupy a large area, which makes it difficult for the display panel to implement a narrow bezel.

SUMMARY

The present disclosure provides a scanning circuit, a display panel and a display device to achieve a narrow bezel of the display panel and the display device.

The present disclosure provides a scanning circuit. The scanning circuit includes a scanning signal output module, a light emitting control signal output module, a first output control module, a second output control module, a reset module, a clock signal input terminal, a first potential signal input terminal, a second potential signal input terminal, a scanning signal output terminal, a light emitting control signal output terminal, a shift signal input terminal and a reset control signal input terminal.

The first output control module is electrically connected to the shift signal input terminal, the first potential signal input terminal, a first node and a second node, and is configured to control a potential of the first node according to a signal input from the shift signal input terminal, a signal input from the first potential signal input terminal and a potential of the second node.

The second output control module is electrically connected to the first potential signal input terminal, the second potential signal input terminal, the first node and a third node, and is configured to control a potential of the third node according to the signal input from the first potential signal input terminal, a signal input from the second potential signal input terminal and the potential of the first node.

The reset module is electrically connected to the reset control signal input terminal, the first potential signal input terminal, the first node and the scanning signal output terminal, and is configured to control the potential of the first node according to a signal input from the reset control signal input terminal and the signal input from the first potential signal input terminal, and to reset a signal output from the scanning signal output terminal according to the signal input from the reset control signal input terminal.

The scanning signal output module is electrically connected to the clock signal input terminal, the first potential signal input terminal, the first node, the second node and the scanning signal output terminal, and is configured to transmit a signal input from the clock signal input terminal to the scanning signal output terminal according to the potential of the first node, or transmit the signal input from the first potential signal input terminal to the scanning signal output terminal according to the potential of the second node.

The light emitting control signal output module is electrically connected to the first node, the second node, the third node, the first potential signal input terminal and the second potential signal input terminal, the second node is electrically connected to the light emitting control signal output terminal, and the light emitting control signal output module is configured to transmit the signal input from the first potential signal input terminal to the second node according to the potential of the first node, or transmit the signal input from the second potential signal input terminal to the second node according to the potential of the third node.

The present disclosure also provides a display panel. The display panel includes the scanning circuit provided in the first aspect, a first clock signal line, a second clock signal line, a first potential signal line, a second potential signal line, and a start signal line.

In each of the at least two scanning circuits, the first potential signal input terminal is electrically connected to the first potential signal line, and the second potential signal input terminal is electrically connected to the second potential signal line.

The at least two scanning circuits are connected in cascade, and the shift signal input terminal of a first-stage scanning circuit of the at least two scanning circuits is electrically connected to the start signal line; in two adjacent stages of the at least two scanning circuits, the scanning signal output terminal of a previous-stage scanning circuit is electrically connected to the shift signal input terminal of a subsequent-stage scanning circuit.

In the two adjacent stages of the at least two scanning circuits, the clock signal input terminal of the previous-stage scanning circuit is electrically connected to the first clock signal line, and the clock signal input terminal of the subsequent-stage scanning circuit is electrically connected to the second clock signal line.

The reset control signal input terminal of the previous-stage scanning circuit is electrically connected to the scanning signal output terminal of the subsequent-stage scanning circuit.

Embodiments of the present disclosure further provide a display device. The display device includes the display panel provided in the second aspect.

The embodiment of the present disclosure provides the scanning circuit, the display panel and the display device. The display panel includes the scanning signal output module, the light emitting control signal output module, the first output control module, the second output control module, the reset module, the clock signal input terminal, the first potential signal input terminal, the second potential signal input terminal, the scanning signal output terminal, the light emitting control signal output terminal, the shift signal input terminal and the reset control signal input terminal. The scanning circuit can output both the scanning signal and the light emitting control signal, and includes fewer modules, helping to reduce the number of components in the circuit; and the scanning circuit includes a small number of signal lines, so that the occupied area of the scanning circuit can be further reduced, helping to achieve a narrow bezel. Compared with the related art, this embodiment provides the scanning circuit in which the driving circuit for generating the scanning signal and the driving circuit for generating the light emitting control signal can have shared components, thereby reducing the number of components and signal lines in the scanning circuit, reducing the occupied area of the scanning circuit, shortening the bezel of the display panel, and improving the user experience.

DETAILED DESCRIPTION

Figure 1:
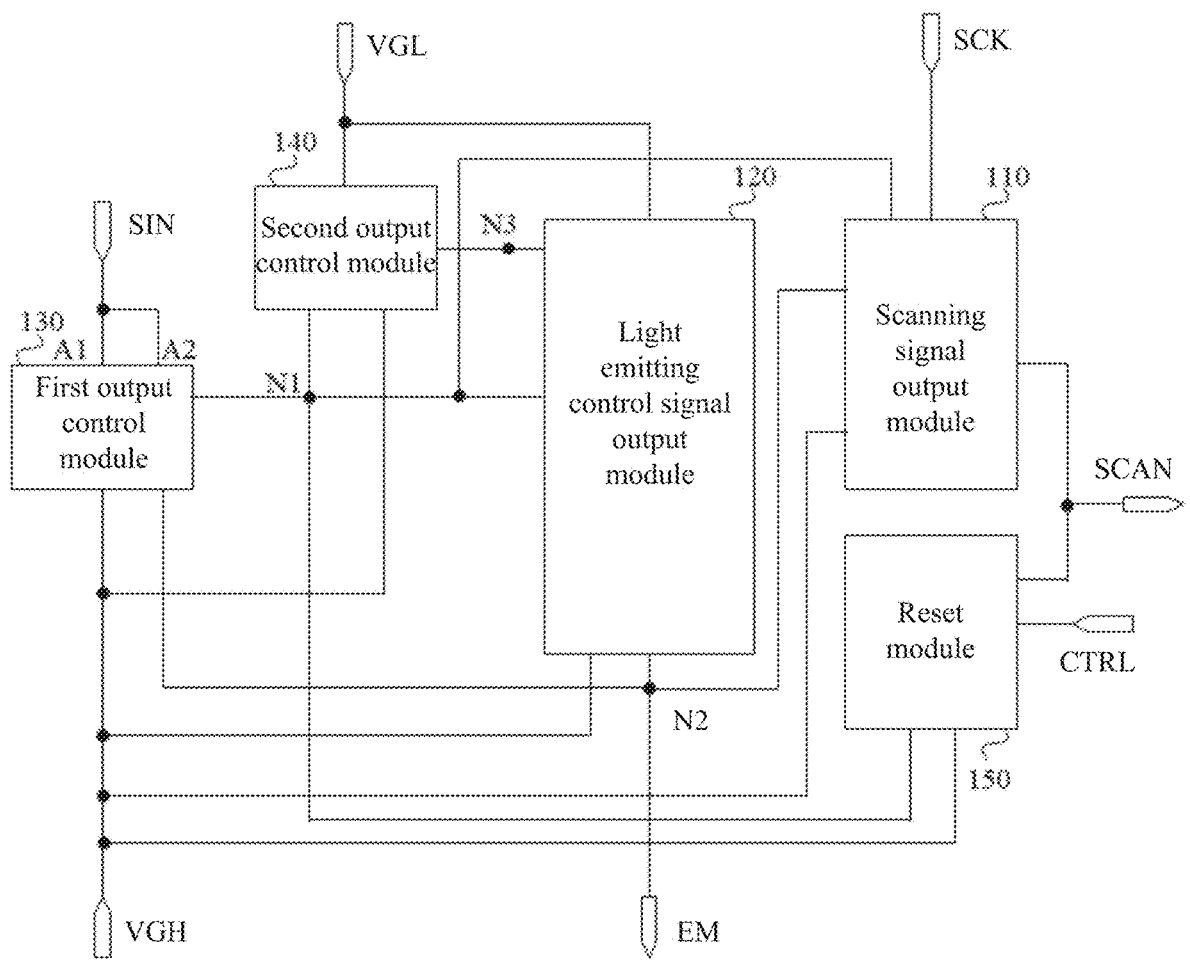
FIG. 1 is a structure diagram of a scanning circuit provided by embodiment one of the present disclosure.

The present disclosure is described hereinafter in conjunction with drawings and embodiments.

The embodiments described herein are intended to explain the present disclosure and not to limit the present disclosure. Additionally, for ease of description, only part, not all, of structures related to the present disclosure are illustrated in the drawings.

The bezel part of the display panel in the related art includes a scanning circuit, a power signal line and the like, and the scanning circuit needs to occupy a large area, which makes it difficult for the display panel to achieve a narrow bezel. The reason for the above problem is as below. The scanning circuit generally includes a scanning drive circuit (Scan circuit) that generates a scanning signal and a light emitting drive circuit (EM circuit) that generates a light emitting signal. Each of the Scan circuit and the EM circuit includes multiple thin film transistor devices, a capacitor device, a clock signal line, a control signal line and the like. For example, a common Scan circuit in the related art includes a 8T2C (8 thin film transistors and 2 capacitors) structure. A common EM circuit in the related art includes a 10T3C (10 thin film transistors and 3 capacitors) structure. In addition, the Scan circuit and the EM circuit are arranged independently, that is, the thin film transistors, the capacitors, the clock signal lines, the control signal lines and the like of the two circuits are not shared, resulting in that there are many devices and signal lines in the scanning circuit. As a result, the scanning circuit occupies a larger area, and thus it is difficult for the display panel to implement a narrow frame.

The embodiment of the present disclosure provides a scanning circuit. FIG. 1 is a structure diagram of a scanning circuit provided by embodiment one of the present disclosure. Referring to FIG. 1, the scanning circuit includes a scanning signal output module 110, a light emitting control signal output module 120, a first output control module 130, a second output control module 140, a reset module 150, a clock signal input terminal SCK, a first potential signal input terminal VGH, a second potential signal input terminal VGL, a scanning signal output terminal SCAN, a light emitting control signal output terminal EM, a shift signal input terminal SIN and a reset control signal input terminal CTRL. The first output control module 130 is electrically connected to the shift signal input terminal SIN, the first potential signal input terminal VGH, a first node N1 and a second node N2, and is configured to control a potential of the first node N1. The second output control module 140 is electrically connected to the first potential signal input terminal VGH, the second potential signal input terminal VGL, the first node N1 and a third node N3, and is configured to control a potential of the third node N3. The reset module 150 is electrically connected to the reset control signal input terminal CTRL, the first potential signal input terminal VGH, the first node N1 and the scanning signal output terminal SCAN, and is configured to control the potential of the first node N1 and reset a signal output from the scanning signal output terminal SCAN according to a signal input from the reset control signal input terminal CTRL. The scanning signal output module 110 is electrically connected to the clock signal input terminal SCK, the first potential signal input terminal VGH, the first node N1, the second node N2 and the scanning signal output terminal SCAN, and is configured to transmit a signal input from the clock signal input terminal SCK to the scanning signal output terminal SCAN according to a potential of the first node N1, or transmit a signal input from the first potential signal input terminal VGH to the scanning signal output terminal SCAN according to a potential of the second node N2. The light emitting control signal output module 120 is electrically connected to the first node N1, the third node N3, the second node N2, the first potential signal input terminal VGH and the second potential signal input terminal VGL, the second node N2 is electrically connected to the light emitting control signal output terminal EM, the light emitting control signal output module 120 is configured to transmit a signal input from the first potential signal input terminal VGH to the second node N2 according to a potential of the first node N1, or transmit a signal input from the second potential signal input terminal VGL to the second node N2 according to a potential of the third node N3.

Figure 2:
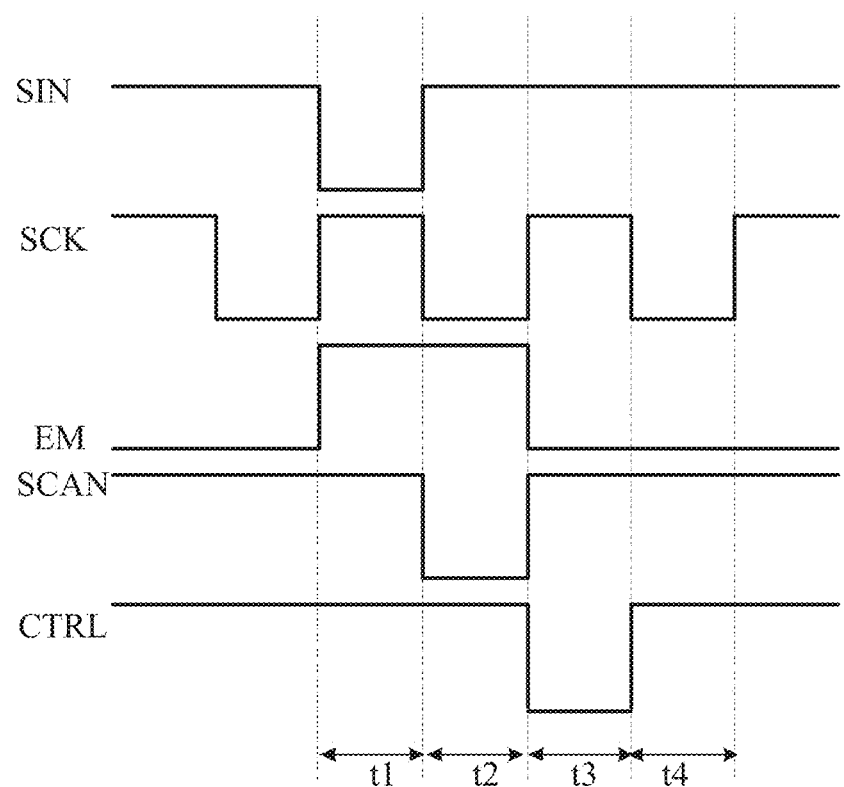
FIG. 2 is a driving timing diagram of a scanning circuit provided by an embodiment of the present disclosure.

FIG. 2 is a driving timing diagram of a scanning circuit provided by an embodiment of the present disclosure. The driving timing can be used for driving the scanning circuit shown in FIG. 1. Referring to FIGS. 1 and 2, an on state of the first output control module 130 is controlled by a shift signal input from the shift signal input terminal SIN, the first output control module 130 may include a first input terminal A1 and a second input terminal A2. The first input terminal A1 and the second input terminal A2 are both electrically connected to the shift signal input terminal SIN, an on state of the second output control module 140 is controlled by a second potential signal and a potential of the first node N1, an on state of the reset module 150 is controlled by a reset control signal, an on state of the light emitting control signal output module 120 is controlled by the potential of the first node N1 and the potential of the third node N3, and a on state of the scanning signal output module 110 is controlled by the potential of the first node N1 and the potential of the second node N2.

Referring to FIGS. 1 and 2, the driving timing of the scanning circuit includes four phases, which are respectively a first phase t1, a second phase t2, a third phase t3 and a fourth phase t4. By way of example, the signal input from the first potential signal input terminal VGH is a high potential signal and the signal input from the second potential signal input terminal VGL is a low potential signal.

In the first phase t1, the shift signal input from the shift signal input terminal SIN has a low potential, and the clock signal input from the clock signal input terminal SCK and the reset control signal input from the reset control signal input terminal CTRL have high potentials. The first output control module 130 is on in response to the low potential shift signal, and transmits the shift signal at this time to the first node N1 so that the potential of the first node N1 is low. The second output control module 140 is on in response to the low potential of the first node N1, and transmits the high potential signal input from the first potential signal input terminal VGH to the third node N3. The scanning signal output module 110 is on in response to the low potential of the first node N1, and transmits the high potential clock signal to the scanning signal output terminal SCAN. The light emitting control signal output module 120 is on in response to the low potential of the first node N1, and transmits the high potential signal input from the first potential signal input terminal VGH to the second node N2, and the second node N2 is electrically connected to the light emitting control signal output terminal EM, so that the high potential signal input from the first potential signal input terminal VGH is transmitted to the light emitting control signal output terminal EM. The reset module 150 is off in response to the high potential reset control signal. That is, in the first phase t1, a scanning signal output from the scanning signal output terminal SCAN is consistent with the clock signal and is a high potential signal, and a light emitting control signal output from the light emitting control signal output terminal EM is consistent with the signal input from the first potential signal input terminal VGH and is a high potential signal.

In the second phase t2, the shift signal input from the shift signal input terminal SIN has a high potential, the clock signal input from the clock signal input terminal SCK has a low potential, and the reset control signal input from the reset control signal input terminal CTRL has a high potential. The scanning signal output module 110 may have a function of storing the potential of the first node N1, and since the scanning signal output module 110 has the function of storing the potential of the first node N1, the first node N1 maintains the low potential. Therefore, the second output control module 140 continues to be on in response to the low potential of the first node N1, and transmits the high potential signal input from the first potential signal input terminal VGH to the third node N3. The scanning signal output module 110 continues to be on in response to the low potential of the first node N1, and transmits the low clock signal input from the clock signal input terminal SCK to the scanning signal output terminal SCAN. The light emitting control signal output module 120 continues to be on in response to the low potential of the first node N1, and transmits the high potential signal input from the first potential signal input terminal VGH to the light emitting control signal output terminal EM. The first output control module 130 is off in response to the high potential shift signal and the high potential of the second node. The reset module 150 is off in response to the high potential reset control signal. That is, in the second phase t2, the scanning signal output from the scanning signal output terminal SCAN is consistent with the clock signal and is a low potential signal, and the light emitting control signal output from the light emitting control signal output terminal EM is consistent with the signal input from the first potential signal input terminal VGH and is a high potential signal.

In the third phase t3, the shift signal input from the shift signal input terminal SIN has a high potential, the clock signal input from the clock signal input terminal SCK has a high potential, and the reset control signal input from the reset control signal input terminal CTRL has a low potential. The reset module 150 is on in response to the low potential reset control signal, transmits the high potential signal input from the first potential signal input terminal VGH to the scanning signal output terminal SCAN, and transmits the high potential signal input from the first potential signal input terminal VGH to the first node N1. The second output control module 140 is on in response to the low potential signal input from the second potential signal input terminal VGL, and transmits the low potential signal input from the second potential signal input terminal VGL to the third node N3. The light emitting control signal output module 120 is on in response to the low potential of the third node N3, and transmits the low potential signal input from the second potential signal input terminal VGL to the light emitting control signal output terminal EM. The first output control module 130 is on in response to the low potential of the second node N2, and transmits the high potential signal input from the first potential signal input terminal VGH to the first node N1. The scanning signal output module 110 is on in response to the low potential of the second node N2, and transmits the high potential signal input from the first potential signal input terminal VGH to the scanning signal output terminal SCAN. That is, in the third phase t3, the scanning signal output from the scanning signal output terminal SCAN is consistent with the signal input from the first potential signal input terminal VGH and is a high potential signal, and the light emitting control signal output from the light emitting control signal output terminal EM is a low potential signal.

In the fourth phase t4, the shift signal input from the shift signal input terminal SIN is a high potential, the clock signal input from the clock signal input terminal SCK has a low potential, and the reset control signal input from the reset control signal input terminal CTRL is a high potential. The second output control module 140 is on in response to the low potential signal input from the second potential signal input terminal VGL, and transmits the low potential signal input from the second potential signal input terminal VGL to the third node N3. The light emitting control signal output module 120 is on in response to the low potential of the third node N3, and transmits the low potential signal input from the second potential signal input terminal VGL to the light emitting control signal output terminal EM. The scanning signal output module 110 is on in response to the low potential of the second node N2, and transmits the high potential signal input from the first potential signal input terminal VGH to the scanning signal output terminal SCAN. The first output control module transmits, in response to the low potential of the second node N2, the high potential signal input from the first potential signal input terminal VGH to the first node N1. The reset module 150 is off in response to the high potential reset control signal. The fourth phase is a potential holding phase, the first node N1 maintains the high potential, the third node N3 maintains the low potential, and the second node N2 maintains the low potential. Correspondingly, the scanning signal output terminal SCAN keeps outputting the high potential signal, and the light emitting control signal output terminal EM keeps outputting the low potential signal.

In the above embodiment, the signal input from the first potential signal input terminal VGH is the high potential signal, the signal input from the second potential signal input terminal VGL is the low potential signal, and the shift signal, the clock signal and the reset control signal are effective at the low potential, which is not intended to limit the present disclosure. In other embodiments, the signal input from the first potential signal input terminal VGH may also be set to a low potential signal, the signal input from the second potential signal input terminal VGL may also be set to a high potential signal, and the shift signal, the clock signal and the reset control signal may also be set to be effective at the high potential. These signals may be set as needed in actual application.

The scanning circuit provided by the embodiment of the present disclosure includes the scanning signal output module, the light emitting control signal output module, the first output control module, the second output control module, the reset module, the clock signal input terminal, the first potential signal input terminal, the second potential signal input terminal, the scanning signal output terminal, the light emitting control signal output terminal, the shift signal input terminal and the reset control signal input terminal. Both the scanning signal and the light emitting control signal can be output through one circuit. The scanning circuit includes fewer modules, helping to reduce the number of components in the circuit, and the scanning circuit includes a small number of signal lines, so that the occupied area of the scanning circuit can be reduced, helping to achieve a narrow bezel; and compared with the related art, this embodiment provides the scanning circuit in which the driving circuit for generating the scanning signal and the driving circuit for generating the light emitting control signal have shared components, thereby reducing the number of components and signal lines in the scanning circuit, reducing the occupied area of the scanning circuit, shortening the bezel of the display panel, and improving the user experience.

Figure 3:
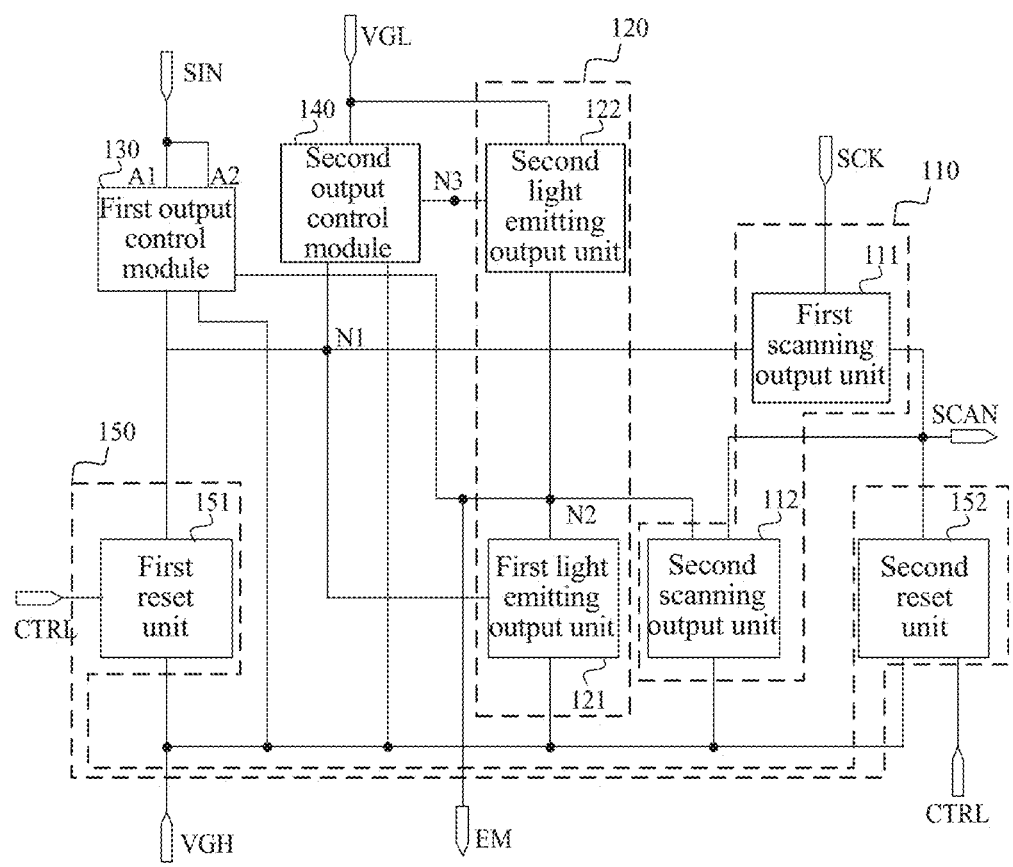
FIG. 3 is a structure diagram of a scanning circuit provided by embodiment two of the present disclosure.

FIG. 3 is a structure diagram of a scanning circuit provided by embodiment two of the present disclosure. Referring to FIG. 3, on the basis of any one of the above technical solutions, the scanning signal output module 110 includes a first scanning output unit 111 and a second scanning output unit 112. The light emitting control signal output module 120 includes a first light emitting output unit 121 and a second light emitting output unit 122, and the reset module 150 includes a first reset unit 151 and a second reset unit 152. The first node N1 is configured to control on states of the first scanning output unit 111 and the first light emitting output unit 121, the third node N3 is configured to control an on state of the second light emitting output unit 122, and the second node N2 is configured to control an on state of the second scanning output unit 112.

The first scanning output unit 111 is electrically connected to the clock signal input terminal SCK, the first node N1 and the scanning signal output terminal SCAN, and when the first scanning output unit 111 is on, a signal input from the clock signal input terminal SCK is transmitted to the scanning signal output terminal SCAN. The second scanning output unit 112 is electrically connected to the first potential signal input terminal VGH, the second node N2 and the scanning signal output terminal SCAN, and when the second scanning output unit 112 is on, a signal input from the first potential signal input terminal VGH is transmitted to the scanning signal output terminal SCAN. The first light emitting output unit 121 is electrically connected to the first node N1, the first potential signal input terminal VGH and the second node N2, and when the first light emitting output unit 121 is on, the signal input from the first potential signal input terminal VGH is transmitted to the second node N2. The second light emitting output unit 122 is electrically connected to the third node N3, the second potential signal input terminal VGL, and the second node N2, and when the second light emitting output unit 122 is on, a signal input from the second potential signal input terminal VGL is transmitted to the second node N2. The first reset unit 151 is electrically connected to the reset control signal input terminal CTRL, the first potential signal input terminal VGH and the first node N1, and when the first reset unit 151 is on, the signal input from the first potential signal input terminal VGH is transmitted to the first node N1. The second reset unit 152 is electrically connected to the reset control signal input terminal CTRL, the first potential signal input terminal VGH and the scanning signal output terminal SCAN, and when the second reset unit 152 is on, the signal input from the first potential signal input terminal VGH is transmitted to the scanning signal output terminal SCAN.

The driving timing of the scanning circuit shown in FIG. 2 is also applicable to the scanning circuit shown in FIG. 3. Referring to FIGS. 2 and 3, the driving timing of the scanning circuit also includes four phases, which are a first phase t1, a second phase t2, a third phase t3, and a fourth phase t4 respectively. For example, the signal input from the first potential signal input terminal VGH is a high potential signal and the signal input from the second potential signal input terminal VGL is a low potential signal.

In the first phase t1, the shift signal input from the shift signal input terminal SIN has a low potential, the clock signal input from the clock signal input terminal SCK and the reset control signal input from the reset control signal input terminal CTRL have high potentials. The first output control module 130 is on in response to the low potential shift signal, and transmits the shift signal at this time to the first node N1 so that the potential of the first node N1 is low. The first scanning output unit 111 is on in response to the low potential of the first node N1, and transmits the high potential clock signal to the scanning signal output terminal SCAN. The first light emitting output unit 121 is on in response to the low potential of the first node N1, and transmits the high potential signal input from the first potential signal input terminal VGH to the second node N2. The second node N2 is electrically connected to the light emitting control signal output terminal EM, so that the high potential signal input from the first potential signal input terminal VGH is transmitted to the light emitting control signal output terminal EM. The second output control module 140 is on in response to the low potential of the first node N1, and transmits the high potential signal input from the first potential signal input terminal VGH to the third node N3. The second light emitting output unit 122 is off in response to the high potential of the third node N3. The second scanning output unit 112 is off in response to the high potential signal of the second node N2. Each of the first reset unit 151 and the second reset unit 152 is off in response to the high potential reset control signal input from the reset control signal input terminal CTRL. That is, in the first phase t1, the scanning signal output from the scanning signal output terminal SCAN is consistent with the clock signal and is a high potential signal, and the light emitting control signal output from the light emitting control signal output terminal EM is consistent with the signal input from the first potential signal input terminal VGH and is a high potential signal.

In the second phase t2, the shift signal input from the shift signal input terminal SIN has a high potential, the clock signal input from the clock signal input terminal SCK has a low potential, and the reset control signal input from the reset control signal input terminal CTRL has a high potential. The first scanning output unit 111 may have a function of storing the potential of the first node N1, and since the first scanning output unit 111 has the function of storing the potential of the first node N1, the first node N1 maintains the low potential. Therefore, the first scanning output unit 111 continues to be on in response to the low potential of the first node N1, and transmits the low potential clock signal input from the clock signal input terminal SCK to the scanning signal output terminal SCAN. The first light emitting output unit 121 continues to be on in response to the low potential of the first node N1, and transmits the high potential signal input from the first potential input terminal VGH to the light emitting control signal output terminal EM, and correspondingly, the potential of the second node N2 is high. The second output control module 140 is on in response to the low potential of the first node N1, and transmits the high potential signal input from the first potential signal input terminal VGH to the third node N3. The second light emitting output unit 122 is off in response to the high potential of the third node N3. The second scanning output unit 112 is off in response to the high potential signal of the second node N2. The first output control module 130 is off in response to the high potential shift signal and the high potential of the second node N2. Each of the first reset unit 151 and the second reset unit 152 is off in response to the high potential reset control signal input from the reset control signal input terminal CTRL. That is, in the second phase t2, the scanning signal output from the scanning signal output terminal SCAN is consistent with the clock signal and is a low potential signal, and the light emitting control signal output from the light emitting control signal output terminal EM is consistent with the signal input from the first potential signal input terminal VGH and is a high potential signal.

In the third phase t3, the shift signal input from the shift signal input terminal SIN has a high potential, the clock signal input from the clock signal input terminal SCK has a high potential, and the reset control signal input from the reset control signal input terminal CTRL has a low potential. The second reset unit 152 is on in response to the low potential reset control signal, and transmits the high potential signal input from the first potential signal input terminal VGH to the scanning signal output terminal SCAN. The first reset unit 151 is on in response to the low potential reset control signal, and transmits the high potential signal input from the first potential signal input terminal VGH to the first node N1. The first scanning output unit 111 is off in response to the high potential of the first node N1, and the first light emitting output unit 121 is off in response to the high potential of the first node N1. The second output control module 140 is on in response to the low potential signal input from the second potential signal input terminal VGL, and transmits the low potential signal input from the second potential signal input terminal VGL to the third node N3. The second light emitting output unit 122 is on in response to the low potential of the third node N3, and transmits the low potential signal input from the second potential signal input terminal VGL to the light emitting control signal output terminal EM, and correspondingly, the potential of the second node N2 is low. The second scanning output unit 112 is on in response to the low potential of the second node N2, and transmits the high potential signal input from the first potential signal input terminal VGH to the scanning signal output terminal SCAN. The first output control module 130 is on in response to the low potential of the second node N2, and transmits the high potential signal input from the first potential signal input terminal VGH to the first node N1. That is, in the third phase t3, the scanning signal output from the scanning signal output terminal SCAN is consistent with the signal input from the first potential signal input terminal VGH and is a high potential signal, and the light emitting control signal output from the light emitting control signal output terminal EM is a low potential signal.

In the fourth phase t4, the shift signal input from the shift signal input terminal SIN is has a high potential, the clock signal input from the clock signal input terminal SCK has a high potential, and the reset control signal input from the reset control signal input terminal CTRL has a high potential. The second output control module 140 is on in response to the low potential signal input from the second potential signal input terminal VGL, and transmits the low potential signal input from the second potential signal input terminal VGL to the third node N3. The second light emitting output unit 122 is on in response to the low potential of the third node N3, and transmits the low potential signal input from the second potential signal input terminal VGL to the light emitting control signal output terminal EM, and correspondingly, the potential of the second node N2 is low. The first output control module 130 is on in response to the low potential of the second node N2, and transmits the high potential signal input from the first potential signal input terminal VGH to the first node N1. The second scanning output unit 112 is on in response to the low potential of the second node N2, and transmits the high potential signal input from the first potential signal input terminal VGH to the scanning signal output terminal SCAN. The first output control module 130 is on in response to the low potential of the second node N2, and transmits the high potential signal input from the first potential signal input terminal VGH to the first node N1. The second scanning output unit 112 is on in response to the low potential of the second node N2, and transmits the high potential signal input from the first potential signal input terminal VGH to the scanning signal output terminal SCAN. The first output control module 130 is on in response to the low potential of the second node N2, and transmits the high potential signal input from the first potential signal input terminal VGH to the first node N1. The first scanning output unit 111 is off in response to the high potential of the first node N1. The first light emitting output unit 121 is off in response to the high potential of the first node N1. Each of the first reset unit 151 and the second reset unit 152 is off in response to the high potential reset control signal input from the reset control signal input terminal CTRL. The fourth phase is a potential holding phase, the first node N1 maintains the high potential, the first scanning output unit 111 and the first light emitting output unit 121 are off in response to the high potential of the first node N1. The third node N3 maintains the low potential, and the second node N2 maintains the low potential. The second light emitting output unit 122 is on in response to the low potential of the third node N3, and transmits the low potential signal input from the second potential signal input terminal VGL to the light emitting control signal output terminal EM. The second scanning output unit 112 is on in response to the low potential of the second node N2, and transmits the high potential signal input from the first potential signal input terminal VGH to the scanning signal output terminal SCAN. The first output control module 130 is on in response to the low potential of the second node N2, and transmits the high potential signal input from the first potential signal input terminal VGH to the first node N1. The scanning signal output terminal SCAN keeps outputting the high potential signal, and the light emitting control signal output terminal EM keeps outputting the low potential signal.

In the scanning circuit provided in this embodiment, the scanning signal output module 110 is divided into the first scanning output module and the second scanning output module, the light emitting control signal output module 120 is divided into the first light emitting output unit and the second light emitting output unit, and the reset module 150 is divided into the first reset unit 151 and the second reset unit 152, so that the scanning signal and the light emitting control signal output by the scanning circuit can be more effectively controlled, and the scanning signal and the light emitting control signal output from the scanning circuit can be more stable and accurate.

Figure 4:
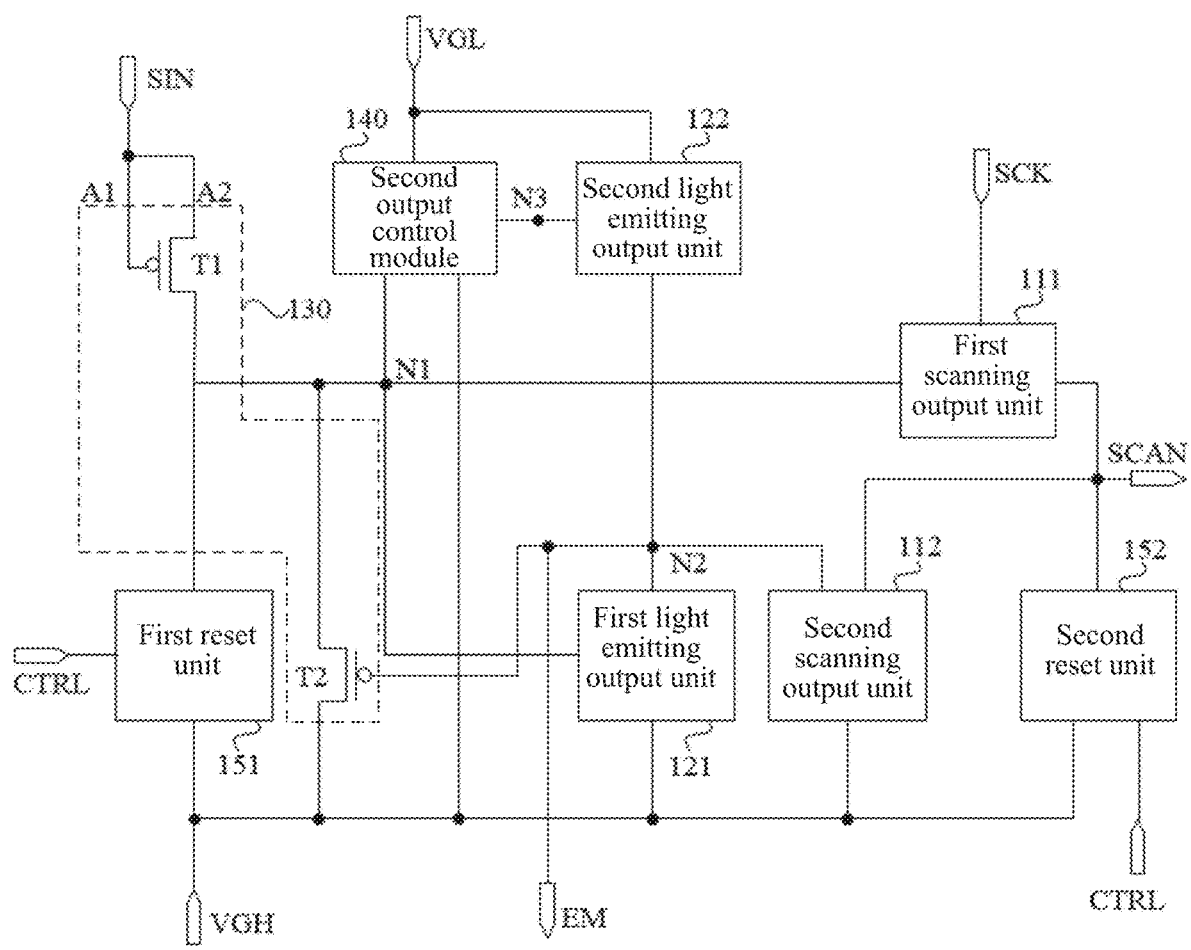
FIG. 4 is a structure diagram of a scanning circuit provided by embodiment three of the present disclosure.

FIG. 4 is a structure diagram of a scanning circuit provided by embodiment three of the present disclosure. Referring to FIG. 4, on the basis of any one of the above technical solutions, in an embodiment, the first output control module 130 includes a first transistor T1 and a second transistor T2, a gate and a first pole of the first transistor T1 are electrically connected to the shift signal input terminal SIN, and a second pole of the first transistor T1 is electrically connected to the first node N1. A gate of the second transistor T2 is electrically connected to the second node N2, a first pole of the second transistor T2 is electrically connected to the first potential signal input terminal VGH, and a second pole of the second transistor T2 is electrically connected to the first node N1.

In an embodiment, the first transistor T1 is turned on or off according to the shift signal input from the shift signal input terminal SIN connected to the gate of the first transistor T1, and in a case where the first transistor T1 is on, the first transistor T1 transmits the shift signal input from the shift signal input terminal SIN to the first node N1. The second transistor T2 is turned on or off according to the potential of the second node N2 connected to the gate of the second transistor T2, and in a case where the second transistor T1 is on, the second transistor T2 transmits the signal input from the first potential signal input terminal VGH to the first node N1. In an embodiment, each of the first transistor T1 and the second transistor T2 may be a P-type transistor or an N-type transistor. For example, in a case where the first transistor T1 and the second transistor T2 are P-type transistors, the first transistor T1 is on in a case where the shift signal input from the gate has a low potential, and the second transistor T2 is on in a case where the potential of the second node N2 is low. The potential of the first node N1 can be controlled through the first transistor T1 and the second transistor T2, and then on or off states of the first scanning output unit 111 and the first light emitting output unit 121 are controlled, thus achieving the output control of the scanning signal and the light emitting control signal. Moreover, the transistor has a simple structure and a simple manufacturing process. When the scanning circuit is applied to a display panel, the transistors in the scanning circuit and transistors on the display panel can be manufactured in a same process flow, thereby saving the process flow and reducing the cost.

Figure 5:
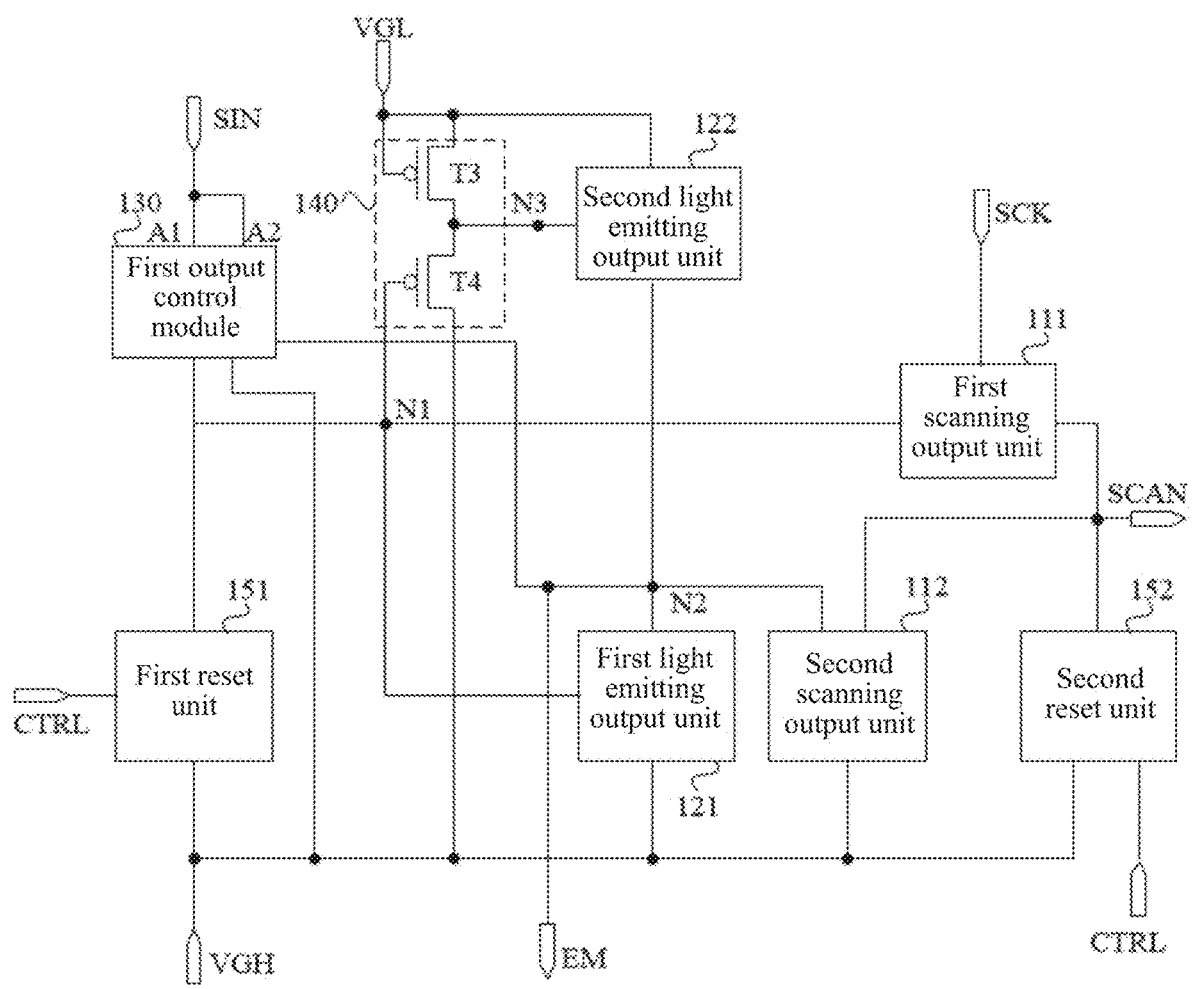
FIG. 5 is a structure diagram of a scanning circuit provided by embodiment four of the present disclosure.

FIG. 5 is a structure diagram of a scanning circuit provided by embodiment four of the present disclosure. Referring to FIG. 5, on the basis of the above technical solutions, in an embodiment, the second output control module 140 includes a third transistor T3 and a fourth transistor T4, a gate and a first pole of the third transistor T3 are electrically connected to the second potential signal input terminal VGL, and a second pole of the third transistor T3 is electrically connected to the third node N3. A gate of the fourth transistor T4 is electrically connected to the first node N1, a first pole of the fourth transistor T4 is electrically connected to the first potential signal input terminal VGH, and a second pole of the fourth transistor T4 is electrically connected to the third node N3.

In an embodiment, the third transistor T3 is turned on or off according to the signal input from the second potential signal input terminal VGL electrically connected to the gate of the third transistor T3, and in a case where the third transistor T3 is on, the third transistor T3 transmits the signal input from the second potential signal input terminal VGL to the third node N3. The fourth transistor T4 is turned on or off according to the potential of the first node N1 electrically connected to the gate of the fourth transistor T4, and in a case where the fourth transistor T4 is on, the fourth transistor T4 transmits a signal input from the first potential signal input terminal VGH to the third node N3. In an embodiment, each of the third transistor T3 and the fourth transistor T4 may be a P-type transistor or an N-type transistor. For example, in a case where the third transistor T3 and the fourth transistor T4 are P-type transistors and the signal input from the second potential signal input terminal VGL is a low potential signal, the low potential signal input from the gate of the third transistor T3 is always in an on state, and the fourth transistor T4 is on in a case where the potential of the first node N1 is low.

The second output control module 140 is provided to include the third transistor T3 and the fourth transistor T4, so that the potential of the third node N3 can be effectively controlled. Moreover, the transistor has a simple structure and a simple manufacturing process. When the scanning circuit is applied to a display panel, the transistors in the scanning circuit and transistors on the display panel can be manufactured in a same process flow, thereby saving the process flow and reducing the cost.

Further referring to FIG. 5, on the basis of the above technical solutions, in an embodiment, a channel width of the third transistor T3 is smaller than a channel width of the fourth transistor T4.

In an embodiment, an example in which the third transistor T3 and the fourth transistor T4 are P-type transistors and the signal input from the second potential signal input terminal VGL is low potential signal is used for illustration. The driving timing of the scanning circuit shown in FIG. 2 is also applicable to the scanning circuit shown in FIG. 5. In the first phase t1 and the second phase t2, the potential of the first node N1 is low, and the fourth transistor T4 is on; and the second potential signal input terminal VGL always inputs the low potential signal, so the third transistor T3 is also on. The channel width of the third transistor T3 is provided to be smaller than the channel width of the fourth transistor T4, so that a charging speed of the fourth transistor T4 can be larger than a discharging speed of the third transistor T3. Then in the case where both the third transistor T3 and the fourth transistor T4 are on, the third node N3 maintains the high potential input from the first potential signal input terminal VGH, so that in the first phase t1 and the second phase t2, the second light emitting output unit 122 is off, the low potential signal input from the second potential signal input terminal VGL cannot be transmitted to the second node N2 and the light emitting control signal output terminal EM, and the high potential signal input from the first potential signal input terminal VGH is transmitted to the second node N2 and the light emitting control signal output terminal EM through the first light emitting output unit 121, thereby effectively controlling the output light emitting control signal.

Figure 6:
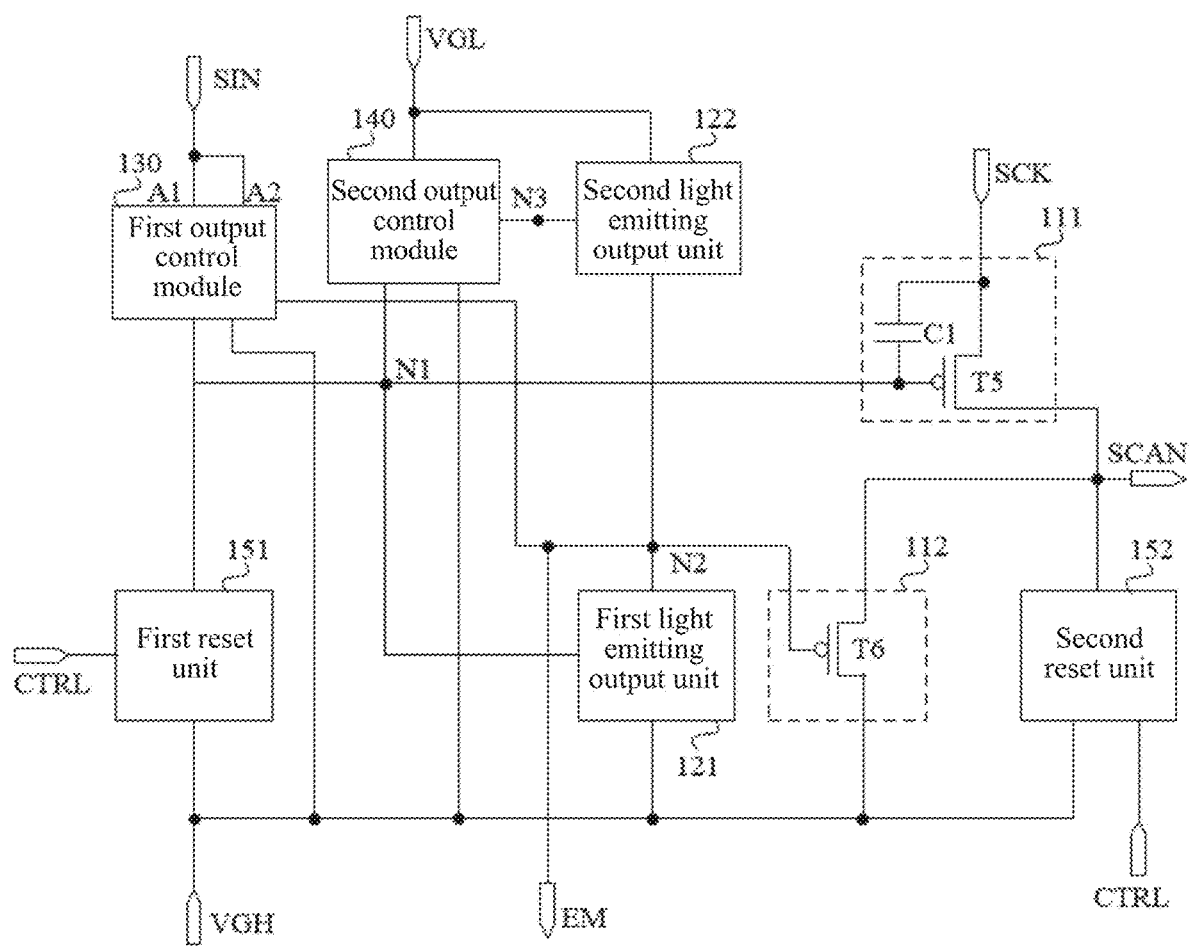
FIG. 6 is a structure diagram of a scanning circuit provided by embodiment five of the present disclosure.

FIG. 6 is a structure diagram of a scanning circuit provided by embodiment five of the present disclosure. Referring to FIG. 6, on the basis of any one of the above technical solutions, in an embodiment, the first scanning output unit 111 includes a fifth transistor T5 and a first capacitor C1, a first terminal of the first capacitor C1 is electrically connected to a gate of the fifth transistor T5, and a second terminal of the first capacitor C1 is electrically connected to a first pole of the fifth transistor T5. The gate of the fifth transistor T5 is electrically connected to the first node N1, the first pole of the fifth transistor T5 is electrically connected to the clock signal input terminal SCK, and a second pole of the fifth transistor T5 is electrically connected to the scanning signal output terminal SCAN. The second scanning signal output unit 112 includes a sixth transistor T6. A gate of the sixth transistor T6 is electrically connected to the second node N2. A first pole of the sixth transistor T6 is electrically connected to the first potential signal input terminal VGH. A second pole of the sixth transistor T6 is electrically connected to the scanning signal output terminal SCAN.

The fifth transistor T5 can be turned on or off according to the potential of the first node N1 electrically connected to the gate of the fifth transistor T5, and in a case where the fifth transistor T5 is on, the fifth transistor T5 transmits a clock signal input from the clock signal input terminal SCK to the scanning signal output terminal SCAN, and the first capacitor C1 has a storage function and can store the potential of the first node N1. The sixth transistor T6 can be turned on or off according to the potential of the second node N2 electrically connected to the gate of the sixth transistor T6, and in a case where the sixth transistor T6 is on, a signal input from the first potential signal input terminal VGH to the scanning signal output terminal SCAN. For example, in a case where both the fifth transistor T5 and the sixth transistor T6 are P-type transistors, the fifth transistor T5 is on in a case where the potential of the first node N1 is low, and the sixth transistor T6 is on in a case where the potential of the second node N2 is low.

The first scanning output unit 111 is provided to include the fifth transistor T5 and the second scanning output unit 112 is provided to include the sixth transistor T6, so that a scanning signal output by the scanning signal output terminal SCAN can be effectively controlled. Moreover, the transistor has a simple structure and a simple manufacturing process. When the scanning circuit is applied to a display panel, the transistors in the scanning circuit and transistors on the display panel can be manufactured in a same process flow, thereby saving the process flow and reducing the cost.

Figure 7:
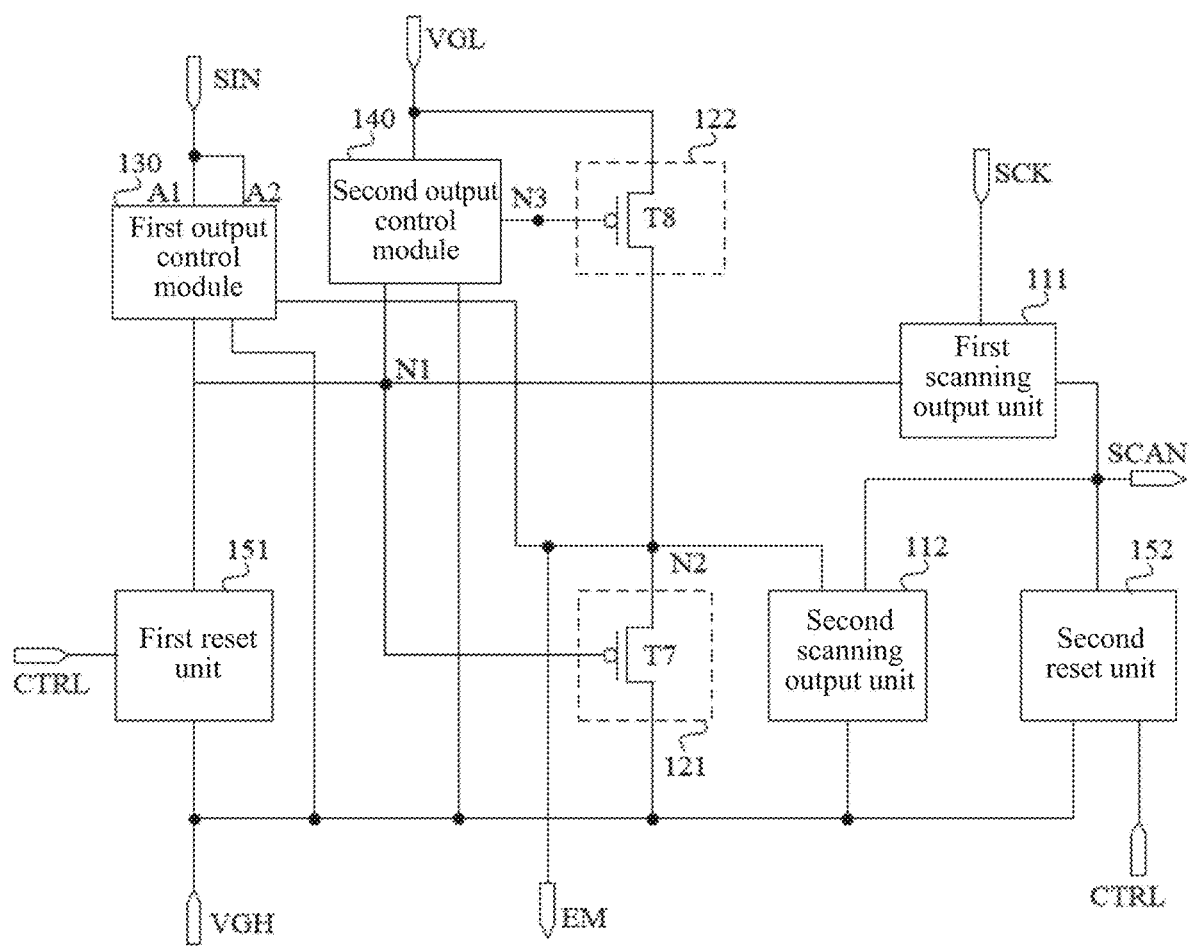
FIG. 7 is a structure diagram of a scanning circuit provided by embodiment six of the present disclosure.

FIG. 7 is a structure diagram of a scanning circuit provided by embodiment six of the present disclosure. Referring to FIG. 7, on the basis of any one of the above technical solutions, the first light emitting output unit 121 includes a seventh transistor T7, a gate of the seventh transistor T7 is electrically connected to the first node N1, a first pole of the seventh transistor T7 is electrically connected to the first potential signal input terminal VGH, and a second pole of the seventh transistor T7 is electrically connected to the second node N2. The second light emitting output unit 122 includes an eighth transistor T8, a gate of the eighth transistor T8 is electrically connected to the third node N3, a first pole of the eighth transistor T8 is electrically connected to the second potential signal input VGL, and a second pole of the eighth transistor T8 is electrically connected to the second node N2.

The seventh transistor T7 can be turned on or off according to the potential of the first node N1 electrically connected to the gate of the seventh transistor T7, and in a case where the seventh transistor T7 is on, the seventh transistor T7 transmits a signal input from the first potential signal input terminal VGH to the second node N2 and the light emitting control signal output terminal EM. The eighth transistor T8 can be turned on or off according to the potential of the third node N3 electrically connected to the gate of the eighth transistor T8. In a case where the eighth transistor T8 is on, the eighth transistor T8 transmits a signal input from the second potential signal input terminal VGL to the second node N2 and the light emitting control signal output terminal EM. For example, in a case where the seventh transistor T7 and the eighth transistor T8 are P-type transistors, the seventh transistor T7 is on in a case where the potential of the first node N1 is low, and the eighth transistor T8 is on in a case where the potential of the third node N3 is low.

The first light emitting output unit 121 is provided to include the seventh transistor T7 and the second light emitting output unit 122 is provided to include the eighth transistor T8, so that a light emitting control signal output by the light emitting control signal output terminal EM can be effectively controlled. Moreover, the transistor has a simple structure and a simple manufacturing process. When the scanning circuit is applied to a display panel, the transistors in the scanning circuit and transistors on the display panel can be manufactured in a same process flow, thereby saving the process flow and reducing the cost.

Figure 8:
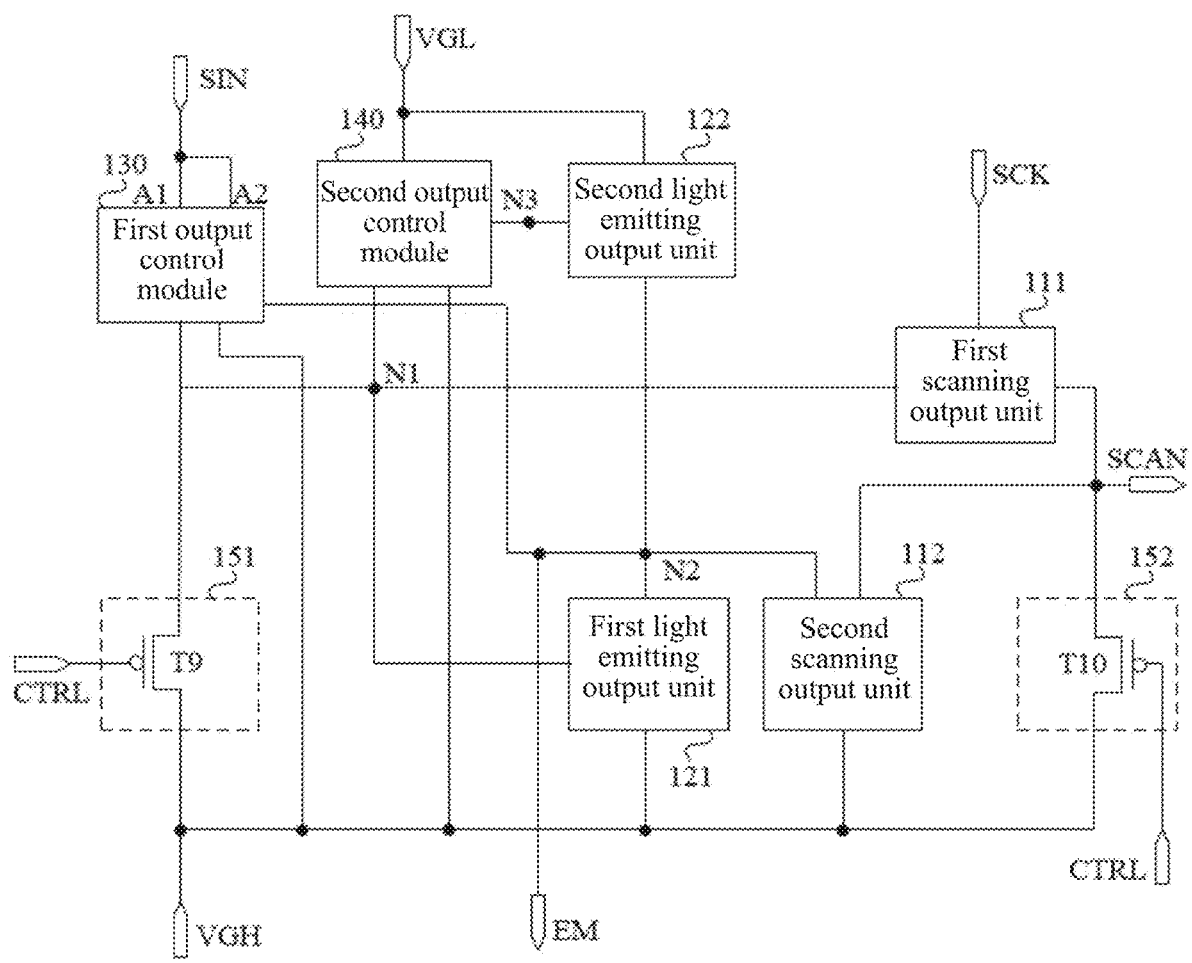
FIG. 8 is a structure diagram of a scanning circuit provided by embodiment seven of the present disclosure.

FIG. 8 is a structure diagram of a scanning circuit provided by embodiment seven of the present disclosure. Referring to FIG. 8, on the basis of any one of the above technical solutions, in an embodiment, the first reset unit 151 includes a ninth transistor T9, and the second reset unit 152 includes a tenth transistor T10. A gate of the ninth transistor T9 is electrically connected to the reset control signal input terminal CTRL, a first pole of the ninth transistor T9 is electrically connected to the first potential signal input terminal VGH, and a second pole of the ninth transistor T9 is electrically connected to the first node N1. A gate of the tenth transistor T10 is electrically connected to the reset control signal input terminal CTRL, a first pole of the tenth transistor T10 is electrically connected to the first potential signal input terminal VGH, and a second pole of the tenth transistor T10 is electrically connected to the scanning signal output terminal SCAN.

The ninth transistor T9 can be turned on or off according to the reset signal input from the reset control signal input terminal CTRL electrically connected to the gate of the ninth transistor T9, and in a case where the ninth transistor T9 is on, the ninth transistor T9 transmits the signal input from the first potential signal input terminal VGH to the first node N1. The tenth transistor T10 can be turned on or off according to the reset signal input from the reset control signal input terminal CTRL electrically connected to the gate of the tenth transistor T10, and in a case where the tenth transistor T10 is on, the tenth transistor T10 transmits the signal input from the first potential signal input terminal VGH to the scanning signal output terminal SCAN. For example, in a case where both the ninth transistor T9 and the tenth transistor T10 are P-type transistors, the ninth transistor T9 and the tenth transistor T10 are on in a case where the reset signal input from the reset control signal input terminal CTRL has a low potential.

The first reset unit 151 is provided to include a ninth transistor T9 so that the potential of the first node N1 can be controlled by the reset signal input from the reset control signal input terminal CTRL, and the second reset unit 152 is provided to include a tenth transistor T10 so that the potential output from the scanning signal output terminal SCAN can be controlled by the reset signal input from the reset signal input terminal. Moreover, the transistor has a simple structure and a simple manufacturing process. When the scanning circuit is applied to a display panel, the transistors in the scanning circuit and transistors on the display panel can be manufactured in a same process flow, thereby saving the process flow and reducing the cost.

Figure 9:
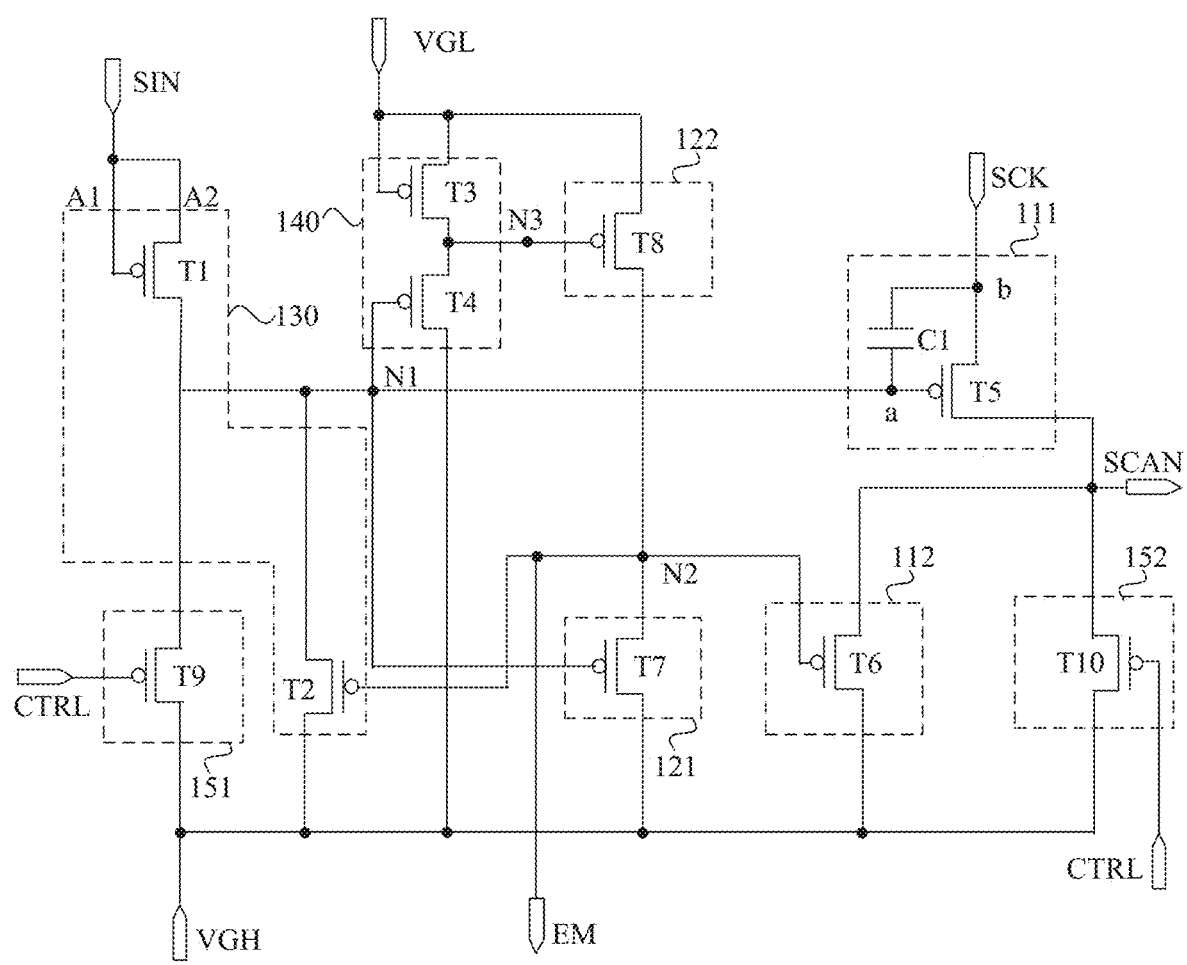
FIG. 9 is a structure diagram of a scanning circuit provided by embodiment eight of the present disclosure.

FIG. 9 is a structure diagram of a scanning circuit provided by embodiment eight of the present disclosure. Referring to FIG. 9, on the basis of any one of the above technical solutions, the first output control module 130 includes a first transistor T1 and a second transistor T2. The second output control module 140 includes a third transistor T3 and a fourth transistor T4. The first scanning output unit 111 includes a fifth transistor T5 and a first capacitor C1. A first terminal of the first capacitor C1 is electrically connected to the gate of the fifth transistor T5, and a second terminal of the first capacitor C1 is electrically connected to a first pole of the fifth transistor T5. The second scanning output unit 112 includes a sixth transistor T6. The first light emitting output unit 121 includes a seventh transistor T7. The second light emitting output unit 122 includes an eighth transistor T8. The first reset unit 151 includes a ninth transistor T9, and the second reset unit 152 includes a tenth transistor T10. A gate and a first pole of the first transistor T1 are electrically connected to the shift signal input terminal SIN, and a second pole of the first transistor T1 is electrically connected to the first node N1. A gate of the second transistor T2 is electrically connected to the second node N2, a first pole of the second transistor T2 is electrically connected to the first potential signal input terminal VGH, and a second pole of the second transistor T2 is electrically connected to the first node N1. A gate and a first pole of the third transistor T3 are both electrically connected to the second potential signal input terminal VGL, and a second pole of the third transistor T3 is electrically connected to the third node N3. A gate of the fourth transistor T4 is electrically connected to the first node N1, a first pole of the fourth transistor T4 is electrically connected to the first potential signal input terminal VGH, and a second pole of the fourth transistor T4 is electrically connected to the third node N3. In an embodiment, a channel width of the third transistor T3 is smaller than a channel width of the fourth transistor T4. A gate of the fifth transistor T5 is electrically connected to the first node N1, a first pole of the fifth transistor T5 is electrically connected to the clock signal input terminal SCK, and a second pole of the fifth transistor T5 is electrically connected to the scanning signal output terminal SCAN. A gate of the sixth transistor T6 is electrically connected to the second node N2, a first pole of the sixth transistor T6 is electrically connected to the first potential signal input terminal VGH, and a second pole of the sixth transistor T6 is electrically connected to the scanning signal output terminal SCAN. A gate of the seventh transistor T7 is electrically connected to the first node N1, a first pole of the seventh transistor T7 is electrically connected to the first potential signal input terminal VGH, and a second pole of the seventh transistor T7 is electrically connected to the second node N2. A gate of the eighth transistor T8 is electrically connected to the third node N3, a first pole of the eighth transistor T8 is electrically connected to the second potential signal input terminal VGL, and a second pole of the eighth transistor T8 is electrically connected to the second node N2. A gate of the ninth transistor T9 is electrically connected to the reset control signal input terminal CTRL, a first pole of the ninth transistor T9 is electrically connected to the first potential signal input terminal VGH, and a second pole of the ninth transistor T9 is electrically connected to the first node N1. A gate of the tenth transistor T10 is electrically connected to the reset control signal input terminal CTRL, a first pole of the tenth transistor T10 is electrically connected to the first potential signal input terminal VGH, and a second pole of the tenth transistor T10 is electrically connected to the scanning signal output terminal SCAN.

The driving timing of the scanning circuit shown in FIG. 2 is also applicable to the scanning circuit shown in FIG. 9. Each of the transistors in the scanning circuit may be a P-type transistor or an N-type transistor. For example, an example in which the transistors in the scanning circuit are P-type transistors, the signal input from the first potential signal input terminal VGH is high and the signal input from the second potential signal input terminal VGL has a low potential. Referring to FIGS. 2 and 9, the driving timing of the scanning circuit includes a first phase t1, a second phase t2, a third phase t3, and a fourth phase t4.

In the first phase t1, a shift signal input from the shift signal input terminal SIN has a low potential, a clock signal input from the clock signal input terminal SCK and a reset control signal input from the reset control signal input terminal CTRL have high potentials. Since both the gate and the first pole of the first transistor T1 are connected to the shift signal input terminal SIN, the first transistor is on in response to the low potential shift signal and transmits the shift signal to the first node N1 so that a potential of the first node N1 is low. In this embodiment, the low potential signal input from the shift signal input terminal SIN may have a same magnitude as the signal (marked as vgl) input from the second potential signal input terminal VGL, and thus the potential of the first node N1 is vgl−Vth, where Vth is a threshold voltage of the first transistor T1. Therefore, a potential of the gate of the fifth transistor T5 is the low potential of the first node N1. A potential of the first pole of the fifth transistor T5 is the high clock signal. The high potential clock signal may have a same magnitude as the signal (marked as vgh) input from the first potential signal input terminal VGH, and thus the fifth transistor T5 is linearly turned on and transmits the high potential clock signal to the scanning signal output terminal SCAN. A voltage difference between the first end and the second end of the first capacitor C1 is Vab=Va−Vb=vgl−Vth−vgh<<Vth (e.g., Vth=−1V, vgl=−7V, vgh=7V), and the first capacitor stores the potential of the first node N1. The seventh transistor T7 is on in response to the low potential of the first node N1, and transmits the high potential signal input from the first potential signal input terminal VGH to the second node N2 and the light emitting control signal output terminal EM. The fourth transistor T4 is on in response to the low potential of the first node N1, and since the gate of the third transistor T3 is connected to the second potential signal input terminal VGL, to effectively control the potential of the third node N3, the channel width of the third transistor T3 is provided to be smaller than the channel width of the fourth transistor T4 so that a discharging speed of the third transistor T3 is smaller than a charging speed of the fourth transistor T4. The high potential signal input from the first potential signal input terminal VGH is transmitted to the third node N3, i.e., enabling the potential of the third node N3 to high. The eighth transistor T8 is off in response to the high potential of the third node N3. The second transistor T2 and the sixth transistor T6 are off in response to the high potential signal of the second node N2. The ninth transistor T9 and the tenth transistor T10 are off in response to the high potential input from the reset control signal input terminal CTRL. That is, in the first phase t1, the scanning signal output terminal SCAN outputs the high potential signal and the light emitting control signal output terminal EM outputs the high potential signal.

In the second phase t2, the shift signal input from the shift signal input terminal SIN has a high potential, the clock signal input from the clock signal input terminal SCK has a low potential, and the reset control signal input from the reset control signal input terminal CTRL has a high potential. The first transistor T1 is off in response to the high potential shift signal input from the shift signal input terminal SIN. The first capacitor C1 has a function of storing the potential of the first node N1, and due to a charge holding function of the first capacitor C1, a voltage difference between the first terminal and the second terminal of the first capacitor C1 is maintained unchanged. Since a signal input from the clock signal input terminal SCK has a low potential, this low potential signal may have the same magnitude as the signal vgl input from the second potential signal input terminal VGL. Since the voltage difference between the first terminal and the second terminal of the first capacitor C1 is maintained, the fifth transistor T5 maintains on, and the fifth transistor T5 outputs the low potential signal to the scanning signal output terminal SCAN. Due to a bootstrapping effect of the first capacitor C1, a potential of a first terminal a of the first capacitor C1 becomes: $2 \times vgl-Vth-vgh$. The seventh transistor T7 continues to be on in response to the low potential of the first node N1, and transmits the high potential signal vgh input from the first potential signal input terminal VGH to the second node N2 and the light emitting control signal output terminal EM. Since the first node N1 maintains the low potential, on or off states of the third transistor T3 and the fourth transistor T4 are the same as the on or off states of the third transistor T3 and the fourth transistor T4 in the first stage T1. Therefore, the third node N3 maintains the high potential vgh, and the eighth transistor T8 is off in response to the high potential of the third node N3. The second node N2 maintains the high potential, and the second transistor T2 and the sixth transistor T6 are off in response to the high potential signal of the second node N2. The ninth transistor T9 and the tenth transistor T10 are off in response to the high potential input from the reset control signal input terminal CTRL. That is, in the second phase t2, the scanning signal output terminal SCAN outputs a low potential signal and the light emitting control signal output terminal EM outputs a high potential signal.

In the third phase t3, the shift signal input from the shift signal input terminal SIN has a high potential, the clock signal input from the clock signal input terminal SCK has a high potential, and the reset control signal input from the reset control signal input terminal CTRL has a low potential. The tenth transistor T10 is on in response to the low potential reset control signal, transmits the high potential signal input from the first potential signal input terminal VGH to the scanning signal output terminal SCAN. The ninth transistor T9 is on in response to the low potential reset control signal, and transmits the high potential signal input from the first potential signal input terminal VGH to the first node N1. The fifth transistor T5 is off in response to the high potential of the first node N1, and the seventh transistor T7 is off in response to the high potential of the first node N1. As for the third transistor T3, the potential of the third node N3 is discharged to vgl−Vth, so that the eighth transistor T8 is turned on, and the second node N2 is discharged. In this case, the eighth transistor T8 is in a saturation on state. In a case where the potential of the second node N2 is discharged to vgl−2Vth, such low level is sufficient to turn on the transistors of the pixel circuit in the display panel. Therefore, a signal output from the light emitting control signal output terminal EM is a low potential signal. The sixth transistor T6 is on in response to the low potential of the second node N2, and transmits the high potential signal input from the first potential signal input terminal VGH to the scanning signal output terminal SCAN. The second transistor T2 is on in response to the low potential of the second node N2, the first transistor T1 is off in response to the high potential shift signal, and the high potential signal input from the first potential signal input terminal VGH is transmitted to the first node N1 through the second transistor T2. The fourth transistor T4 is off in response to the high potential of the first node N1, and the low potential signal input from the second potential signal input terminal VGL is transmitted to the third node N3 through the third transistor T3. That is, in the third phase t3, the scanning signal output terminal SCAN outputs a high potential signal and the light emitting control signal output terminal EM outputs a low potential signal.

In the fourth phase t4, the shift signal input from the shift signal input terminal SIN has a high potential, the clock signal input from the clock signal input terminal SCK has a high potential, and the potential input from the reset control signal input terminal CTRL is high. The fourth phase is a potential holding phase. Due to the storing function of the first capacitor C1, the first node N1 maintains the high potential. Therefore, the fourth transistor T4, the fifth transistor T5, and the seventh transistor T7 are all in an off state as in the third phase T3. The third transistor T3 continues to be on in response to the low potential signal input from the second potential signal input terminal VGL, so that the third node N3 maintains the low potential, and the eighth transistor T8 continues to be in the on state and transmits the low potential signal input from the second potential signal input terminal VGL to the second node N2 and the light emitting control signal output terminal EM, that is, the second node N2 maintains the low potential. The sixth transistor T6 continues to be on in response to the low potential of the second node N2, and transmits the high potential signal input from the first potential signal input terminal VGH to the scanning signal output terminal SCAN. The second transistor T2 continues to be on in response to the low potential of the second node N2, and transmits the high potential signal input from the first potential signal input terminal VGH to the first node N1, so that the first node N1 maintains the high level, thereby enabling the whole scanning circuit to be in a holding state of outputting the scanning signal and the light emitting control signal. In the fourth phase t4, the first transistor T1 continues to be off in response to the high potential shift signal input from the shift signal input terminal SIN. The ninth transistor T9 and the tenth transistor T10 are off in response to the reset signal input from the reset control signal input terminal CTRL. Therefore, in this phase, the scanning signal output terminal SCAN keeps outputting a high potential signal, and the light emitting control signal output terminal EM keeps outputting a low potential signal.

Figure 10:
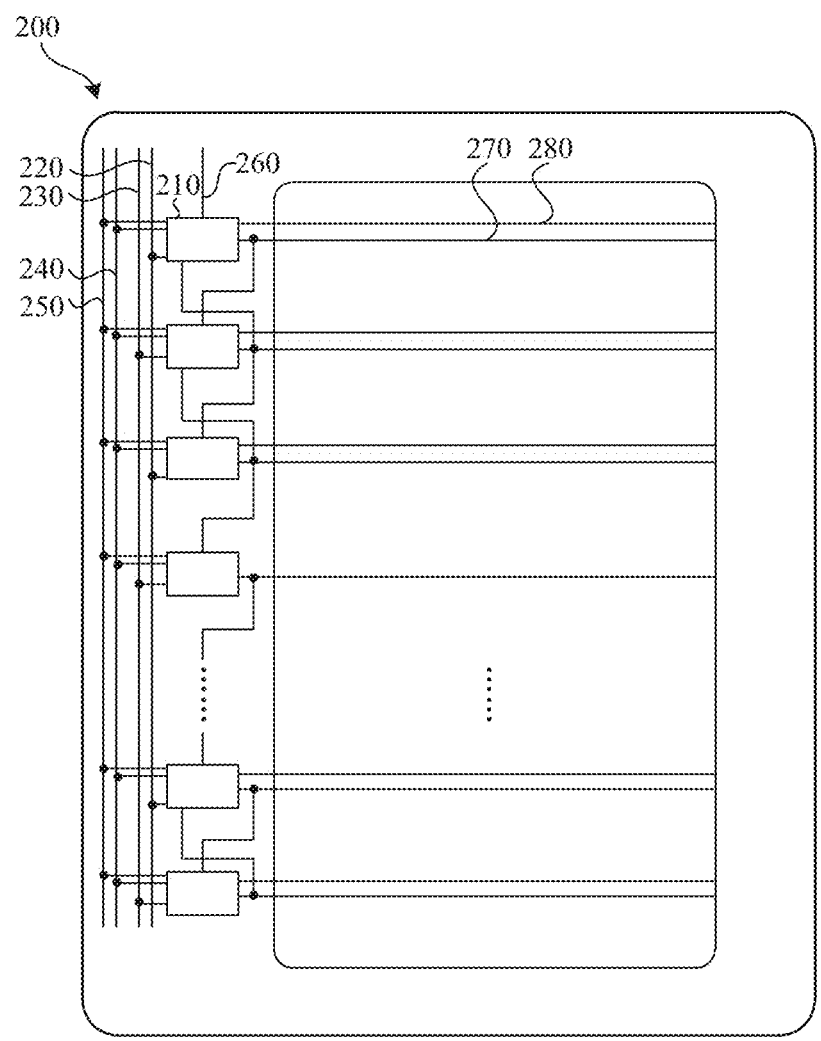
FIG. 10 is a structure diagram of a display panel provided by an embodiment of the present disclosure.

The embodiments of the present disclosure also provide a display panel. FIG. 10 is a structure diagram of a display panel provided by an embodiment of the present disclosure. Referring to FIG. 10, the display panel includes a scanning circuit 210, a first clock signal line 220, a second clock signal line 230, a first potential signal line 240, a second potential signal line 250 and a start signal line 260 provided by any embodiment of the present disclosure. The first potential signal input terminal of the scanning circuit is electrically connected to the first potential signal line 240, and the second potential signal input terminal is electrically connected to the second potential signal line 250. At least two scanning circuits are connected in cascade, and the shift signal input terminal of a first-stage scanning circuit is electrically connected to the start signal line 260. In two adjacent stages of the at least two scanning circuits, the scanning signal output terminal of a previous-stage scanning circuit is electrically connected to the shift signal input terminal of a subsequent-stage scanning circuit. In the two adjacent stages of the at least two scanning circuits, the clock signal input terminal of the previous-stage scanning circuit is electrically connected to the first clock signal line 220, and the clock signal input terminal of the subsequent-stage scanning circuit is electrically connected to the second clock signal line 230. The reset control signal input terminal of the previous-stage scanning circuit is electrically connected to the scanning signal output terminal of the subsequent-stage scanning circuit.

In an embodiment, the display panel may be, for example, an organic light emitting diode display panel, a liquid crystal display panel, an electronic paper display panel or the like. The scanning signal output terminal of the scanning circuit at each stage is electrically connected to a scanning line on the display panel to transmit a scanning signal to the scanning line, and the light emitting control signal output terminal of the scanning circuit at each stage is electrically connected to a light emitting control signal line on the display panel. The first-stage scanning circuit shifts a start signal on the start signal line 260 and outputs the start signal through the scanning signal output terminal. In two adjacent stages of the scanning circuits, the subsequent-stage scanning circuit shifts the scanning signal output from the previous-stage scanning circuit and outputs the scanning signal. The scanning signal output by the subsequent-stage scanning circuit serves as input of the previous-stage scanning circuit, and is electrically connected to the reset control signal input terminal of the previous-stage scanning circuit to perform a reset control on the previous-stage scanning circuit. The scanning signal output from the subsequent-stage scanning circuit serves as the input of the previous-stage scanning circuit, so that it is not necessary to provide a reset control signal line separately, thereby reducing the number of signal lines. In an embodiment, the reset control signal input terminal of a last-stage scanning circuit may be connected to a cut-off signal line. The cut-off signal line may be configured to provide the reset control signal for the last-stage scanning circuit. In an embodiment, the last-stage scanning circuit is not connected to the scanning line and the light emitting control signal line, and is not provided with the cut-off signal line, and the last-stage scanning circuit only serves as a circuit for supplying the reset control signal for a penultimate-stage scanning circuit.

In addition, in two adjacent stages of the scanning circuits, the previous-stage scanning circuit is electrically connected to the first clock signal line 220, and the subsequent-stage scanning circuit is electrically connected to the second clock signal line 230. A clock signal supplied by the first clock signal line 220 is opposite to a clock signal supplied by the second clock signal line 230. The display panel provided by the embodiment of the present disclosure implements the function of outputting the scanning signal and the light emitting control signal line by line, and the scanning signals and the light emitting control signals outputted by the scanning circuits at the multiple stages have a good stability.

It should be noted that the display panel shown in FIG. 10 is schematically illustrated with the scanning circuits located on the bezel of one side of the display panel. In an embodiment, the scanning circuits may be disposed on both sides of the display panel, so that the bezel width of two sides is smaller, the bezel size is more consistent, and the display panel achieves a narrow bezel and has a more beautiful appearance, improving the user experience.

The display panel provided by the embodiment of the present disclosure includes the scanning circuit, the first clock signal line 220, the second clock signal line 230, the first potential signal line 240, the second potential signal line 250 and the start signal line 260 provided by any embodiment of the present disclosure. The scanning circuit can output both the scanning signal and the light emitting control signal, and includes fewer modules, helping to reduce the number of components in the circuit; and the scanning circuit includes a small number of signal lines, so that the occupied area of the scanning circuit can be further reduced, helping to achieve a narrow bezel.

Figure 11:
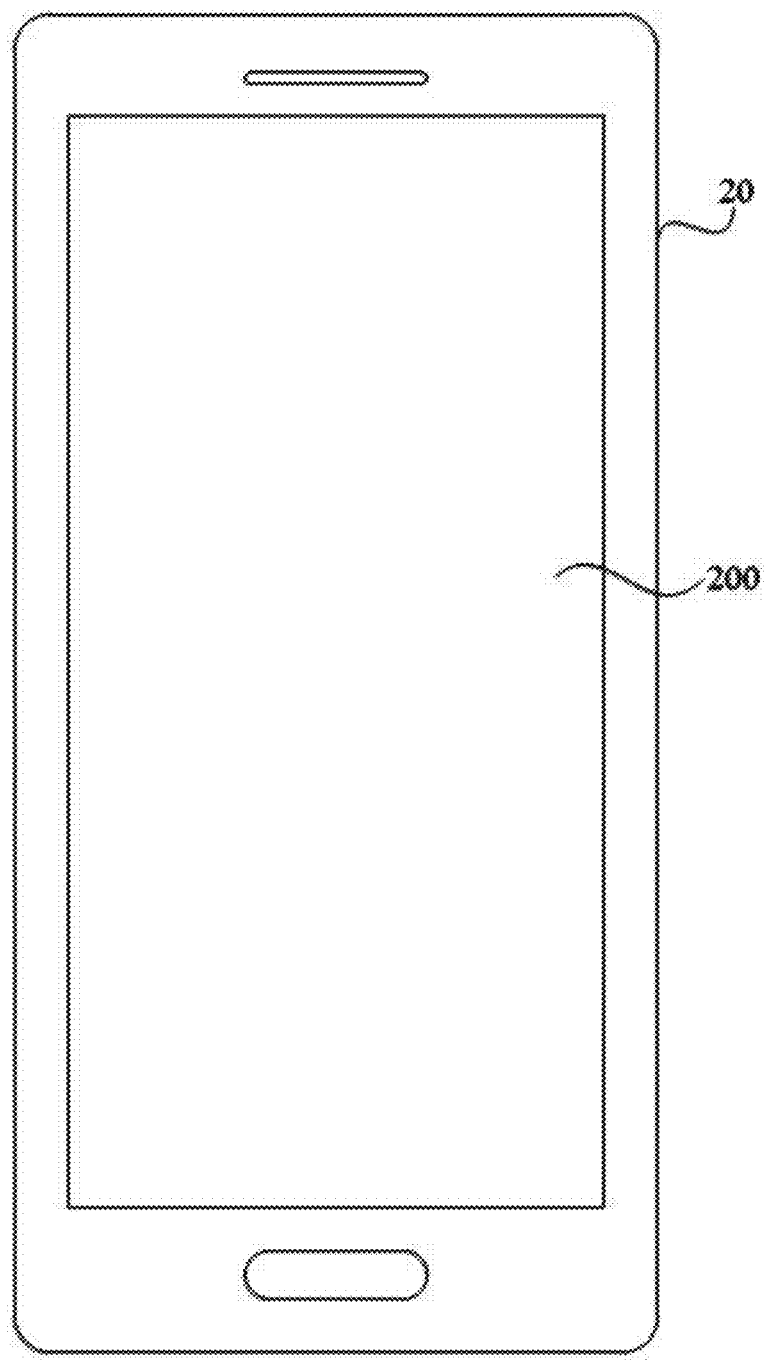
FIG. 11 is a structure diagram of a display device provided by an embodiment of the present disclosure.

An embodiment of the present disclosure further provides a display device. FIG. 11 is a structure diagram of the display device provided by an embodiment of the present disclosure. Referring to FIG. 11, the display device 20 provided by the embodiment of the present disclosure includes the display panel 200 provided by any embodiment of the present disclosure. The display device 20 may be a mobile phone as shown in FIG. 11, may be a computer, a television, an intelligent wearable display device and the like, which is not specifically limited in the embodiment of the present disclosure.

What is claimed is:

1. A scanning circuit, comprising a scanning signal output module, a light emitting control signal output module, a first output control module, a second output control module, a reset module, a clock signal input terminal, a first potential signal input terminal, a second potential signal input terminal, a scanning signal output terminal, a light emitting control signal output terminal, a shift signal input terminal and a reset control signal input terminal;

the first output control module is electrically connected to the shift signal input terminal, the first potential signal input terminal, a first node and a second node, and is configured to control a potential of the first node according to a signal input from the shift signal input terminal, a signal input from the first potential signal input terminal and a potential of the second node;

the second output control module is electrically connected to the first potential signal input terminal, the second potential signal input terminal, the first node and a third node, and is configured to control a potential of the third node according to the signal input from the first potential signal input terminal, a signal input from the second potential signal input terminal and the potential of the first node;

the reset module is electrically connected to the reset control signal input terminal, the first potential signal input terminal, the first node and the scanning signal output terminal, and is configured to control the potential of the first node according to a signal input from the reset control signal input terminal and the signal input from the first potential signal input terminal, and to reset a signal output from the scanning signal output terminal according to the signal input from the reset control signal input terminal;

the scanning signal output module is electrically connected to the clock signal input terminal, the first potential signal input terminal, the first node, the second node and the scanning signal output terminal, and is configured to transmit a signal input from the clock signal input terminal to the scanning signal output terminal according to the potential of the first node, or transmit the signal input from the first potential signal input terminal to the scanning signal output terminal according to the potential of the second node; and the light emitting control signal output module is electrically connected to the first node, the second node, the third node, the first potential signal input terminal and the second potential signal input terminal, the second node is electrically connected to the light emitting control signal output terminal, and the light emitting control signal output module is configured to transmit the signal input from the first potential signal input terminal to the second node according to the potential of the first node, or transmit the signal input from the second potential signal input terminal to the second node according to the potential of the third node, wherein:

the second output control module comprises a third transistor and a fourth transistor, a gate and a first pole of the third transistor is electrically connected to the second potential signal input terminal, and a second pole of the third transistor is electrically connected to the third node;

a gate of the fourth transistor is electrically connected to the first node, a first pole of the fourth transistor is electrically connected to the first potential signal input terminal, and a second pole of the fourth transistor is electrically connected to the third node; and a channel width of the third transistor is less than a channel width of the fourth transistor.

2. The scanning circuit of claim 1, wherein the scanning signal output module comprises a first scanning output unit and a second scanning output unit, the first node is configured to control an on state of the first scanning output unit; and the second node is configured to control an on state of the second scanning output unit;

the first scanning output unit is electrically connected to the clock signal input terminal, the first node and the scanning signal output terminal, and is configured to transmit the signal input from the clock signal input terminal to the scanning signal output terminal when the first scanning output unit is on; and the second scanning output unit is electrically connected to the first potential signal input terminal, the second node and the scanning signal output terminal, and is configured to transmit the signal input from the first potential signal input terminal to the scanning signal output terminal when the second scanning output unit is on.

3. The scanning circuit of claim 2, wherein the light emitting control signal output module comprises a first light emitting output unit and a second light emitting output unit, the first node is further configured to control an on state of the first light emitting output unit; and the third node is configured to control an on state of the second light emitting output unit;

the first light emitting output unit is electrically connected to the first node, the first potential signal input terminal and the second node, and is configured to transmit the signal input from the first potential signal input terminal to the second node when the first light emitting output unit is on;

the second light emitting output unit is electrically connected to the third node, the second potential signal input terminal and the second node, and is configured to transmit the signal input from the second potential signal input terminal to the second node when the second light emitting output unit is on.

4. The scanning circuit of claim 3, wherein the reset module comprises a first reset unit and a second reset unit;

the first reset unit is electrically connected to the reset control signal input terminal, the first potential signal input terminal and the first node, and is configured to transmit the signal input from the first potential signal input terminal to the first node when the first reset unit is on; and the second reset unit is electrically connected to the reset control signal input terminal, the first potential signal input terminal and the scanning signal output terminal, and is configured to transmit the signal input from the first potential signal input terminal to the scanning signal output terminal when the second reset unit is on.

5. The scanning circuit of claim 1, wherein the first output control module comprises a first transistor and a second transistor, a gate and a first pole of the first transistor is electrically connected to the shift signal input terminal, and a second pole of the first transistor is electrically connected to the first node; and a gate of the second transistor is electrically connected to the second node, a first pole of the second transistor is electrically connected to the first potential signal input terminal, and a second pole of the second transistor is electrically connected to the first node.

6. The scanning circuit of claim 2, wherein the first scanning output unit comprises a fifth transistor and a first capacitor, a first terminal of the first capacitor is electrically connected to a gate of the fifth transistor, and a second terminal of the first capacitor is electrically connected to a first pole of the fifth transistor; the gate of the fifth transistor is electrically connected to the first node, the first pole of the fifth transistor is electrically connected to the clock signal input terminal, and a second pole of the fifth transistor is electrically connected to the scanning signal output terminal.

7. The scanning circuit of claim 2, wherein the second scanning signal output unit comprises a sixth transistor; a gate of the sixth transistor is electrically connected to the second node, a first pole of the sixth transistor is electrically connected to the first potential signal input terminal, and a second pole of the sixth transistor is electrically connected to the scanning signal output terminal.

8. The scanning circuit of claim 3, wherein the first light emitting output unit comprises a seventh transistor, a gate of the seventh transistor is electrically connected to the first node, a first pole of the seventh transistor is electrically connected to the first potential signal input terminal, and a second pole of the seventh transistor is electrically connected to the second node.

9. The scanning circuit of claim 3, wherein the second light emitting output unit comprises an eighth transistor; a gate of the eighth transistor is electrically connected to the third node, a first pole of the eighth transistor is electrically connected to the second potential signal input terminal, and a second pole of the eighth transistor is electrically connected to the second node.

10. The scanning circuit of claim 4, wherein the first reset unit comprises a ninth transistor; a gate of the ninth transistor is electrically connected to the reset control signal input terminal, a first pole of the ninth transistor is electrically connected to the first potential signal input terminal, and a second pole of the ninth transistor is electrically connected to the first node.

11. The scanning circuit of claim 4, wherein the second reset unit comprises a tenth transistor, a gate of the tenth transistor is electrically connected to the reset control signal input terminal, a first pole of the tenth transistor is electrically connected to the first potential signal input terminal, and a second pole of the tenth transistor is electrically connected to the scanning signal output terminal.

12. The scanning circuit of claim 5, wherein each of the first transistor and the second transistor is a P-type transistor or an N-type transistor.

13. A display panel, comprising: at least two scanning circuits of claim 1, a first clock signal line, a second clock signal line, a first potential signal line, a second potential signal line and a start signal line;
in each of the at least two scanning circuits, the first potential signal input terminal is electrically connected to the first potential signal line, and the second potential signal input terminal is electrically connected to the second potential signal line;
the at least two scanning circuits are connected in cascade, and the shift signal input terminal of a first-stage scanning circuit of the at least two scanning circuits is electrically connected to the start signal line; in two adjacent stages of the at least two scanning circuits, the scanning signal output terminal of a previous-stage scanning circuit is electrically connected to the shift signal input terminal of a subsequent-stage scanning circuit;
in the two adjacent stages of the at least two scanning circuits, the clock signal input terminal of the previous-stage scanning circuit is electrically connected to the first clock signal line, and the clock signal input terminal of the subsequent-stage scanning circuit is electrically connected to the second clock signal line; and
the reset control signal input terminal of the previous-stage scanning circuit is electrically connected to the scanning signal output terminal of the subsequent-stage scanning circuit.

14. The display panel of claim 13, wherein a clock signal supplied by the first clock signal line is opposite to a clock signal supplied by the second clock signal line.

15. The display panel of claim 13, further comprising: a cut-off signal line, wherein in a case where the subsequent-stage scanning circuit is a last-stage scanning circuit, the reset control signal input terminal of the last-stage scanning circuit is connected to the cut-off signal line, and the cut-off signal line is configured to supply a reset control signal for the last-stage scanning circuit.

16. The display panel of claim 13, wherein the display panel is an organic light emitting diode display panel, a liquid crystal display panel or an electronic paper display panel.

17. A display device, comprising: the display panel of claim 13.

18. The scanning circuit of claim 1, wherein a charging time and a discharging time are different between the fourth transistor and the third transistor.

19. The scanning circuit of claim 18, wherein when both the third transistor and the fourth transistor are on, the third node maintains a potential input from the first potential signal input terminal by at least one predetermined factor, and the at least one predetermined factor includes the difference of the discharging time and the charging time between the third transistor and the fourth transistor.

20. The scanning circuit of claim 6, wherein the first terminal of the first capacitor is further electrically connected to the first node so that a potential of the first node is stored by the first capacitor and maintained for a predetermined period, wherein due to a bootstrapping effect of the first capacitor, the potential of the first node changes from vgl−Vth to 2×vgl−Vth−vgh, wherein vgl is the signal input from the second potential signal input terminal, Vth is a threshold voltage of a first transistor, and vgh is the signal input from the first potential signal input terminal.

* * * * *